United States Patent
Dishongh et al.

(10) Patent No.: US 7,057,114 B2
(45) Date of Patent: *Jun. 6, 2006

(54) CIRCUIT BOARD WITH ADDED IMPEDANCE

(75) Inventors: Terry Dishongh, Hillsboro, OR (US); Prateek Dujari, Portland, OR (US); Bin Lian, Hillsboro, OR (US); Damion Searls, Portland, OR (US)

(73) Assignee: Intel Corporation, Santa Clara, CA (US)

(*) Notice: Subject to any disclaimer, the term of this patent is extended or adjusted under 35 U.S.C. 154(b) by 88 days.

This patent is subject to a terminal disclaimer.

(21) Appl. No.: 10/612,872

(22) Filed: Jul. 7, 2003

(65) Prior Publication Data

US 2004/0057184 A1 Mar. 25, 2004

Related U.S. Application Data

(63) Continuation of application No. 09/473,128, filed on Dec. 28, 1999, now Pat. No. 6,775,122.

(51) Int. Cl.
*H05K 1/00* (2006.01)

(52) U.S. Cl. ............... 174/250; 174/260; 174/262; 361/306.1; 361/306.3; 361/311; 361/313; 361/704; 361/761

(58) Field of Classification Search .......... 174/260, 174/250, 262; 361/311, 313, 321.1, 303, 361/306.3, 704, 761, 306.1
See application file for complete search history.

(56) References Cited

U.S. PATENT DOCUMENTS

| | | | |
|---|---|---|---|
| 6,473,312 B1 * | 10/2002 | Hiratsuka et al. | 361/794 |
| 6,602,078 B1 * | 8/2003 | Kwark | 439/66 |
| 6,653,572 B1 * | 11/2003 | Ishiwa et al. | 174/250 |
| 6,761,816 B1 * | 7/2004 | Blackburn et al. | 205/777.5 |
| 6,775,122 B1 * | 8/2004 | Dishongh et al. | 361/301.5 |

FOREIGN PATENT DOCUMENTS

JP 09214092 A * 8/1997

* cited by examiner

*Primary Examiner*—Nguyen T. Ha
(74) *Attorney, Agent, or Firm*—Kenyon & Kenyon LLP

(57) ABSTRACT

A circuit board includes two planes. A via spans the planes, and an impedance component is placed in the via. The impedance component is coupled to both of the planes. The impedance component provides an impedance between the planes without the use of traces or hand soldering of components.

5 Claims, 2 Drawing Sheets

CIRCUIT BOARD WITH ADDED IMPEDANCE

This application is a continuation of application Ser. No. 09/473,128 filed Dec. 28, 1999 now U.S. Pat. No. 6,775,122.

FIELD OF THE INVENTION

The present invention is directed to semiconductor devices and electronic circuit boards. More particularly, the present invention is directed to added impedance in semiconductor devices and electronic circuit boards.

BACKGROUND OF THE INVENTION

Current designs of semiconductor circuits require certain impedances between the power plane and the ground plane. These impedances are generally placed on the die or on the substrate of the circuitry. For example, decoupling capacitors are typically placed in circuits, between the power plane and ground plane, to stabilize any undue voltage fluctuations in the traces. Similarly, resistances may also be used at various locations in circuits to add impedance.

FIG. 1 illustrates a semiconductor circuit with added impedance using known methods. Between a power plane 10 and ground 16, a surface mount capacitor 12 and a surface mount resistor 14 is added. Capacitor 12 and resistor 14 are usually hand-soldered on the substrate requiring additional resources. They also occupy precious real estate on the substrate. In addition, due to the considerable length of the trace (L) between power plane 10 and ground 16, the trace can act as an antenna for electromagnetic interference ("EMI") and other high frequency noises.

Based on the foregoing, there is a need for an improved method and apparatus for adding impedance between planes in a semiconductor circuit.

SUMMARY OF THE INVENTION

One embodiment of the present invention is a circuit board that includes two planes. A via spans the planes, and an impedance component is placed in the via. The impedance component is coupled to both of the planes.

DETAILED DESCRIPTION

One embodiment of the present invention is a circuit board that includes impedance components inserted in the vias between two planes.

Figure 1:
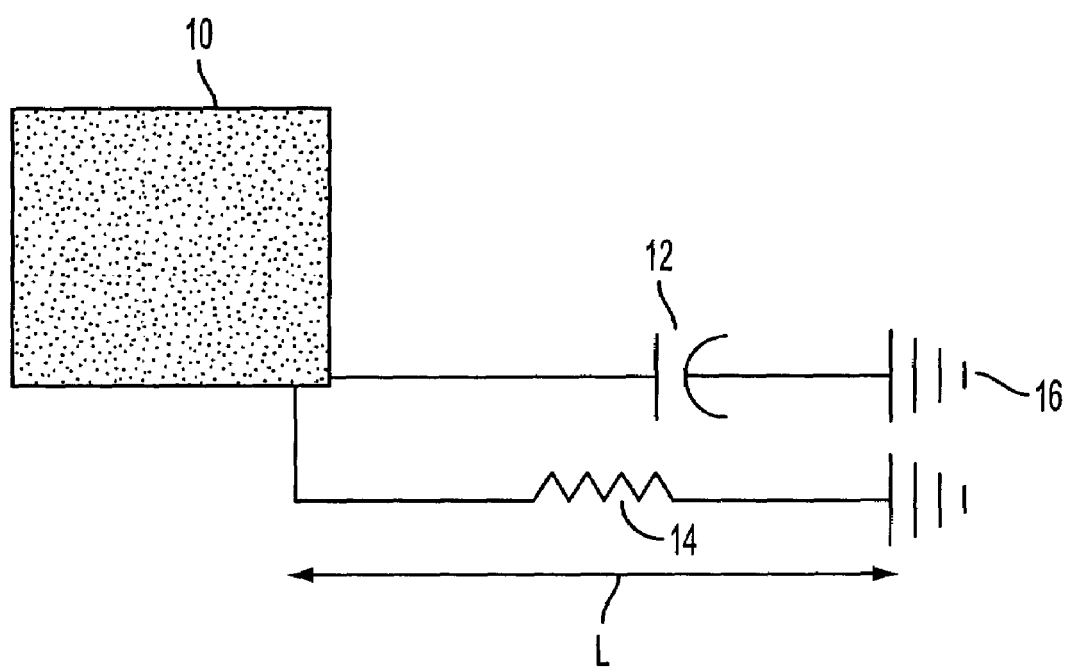
FIG. 1 illustrates in a semiconductor circuit with added impedance using known methods.
Figure 2:
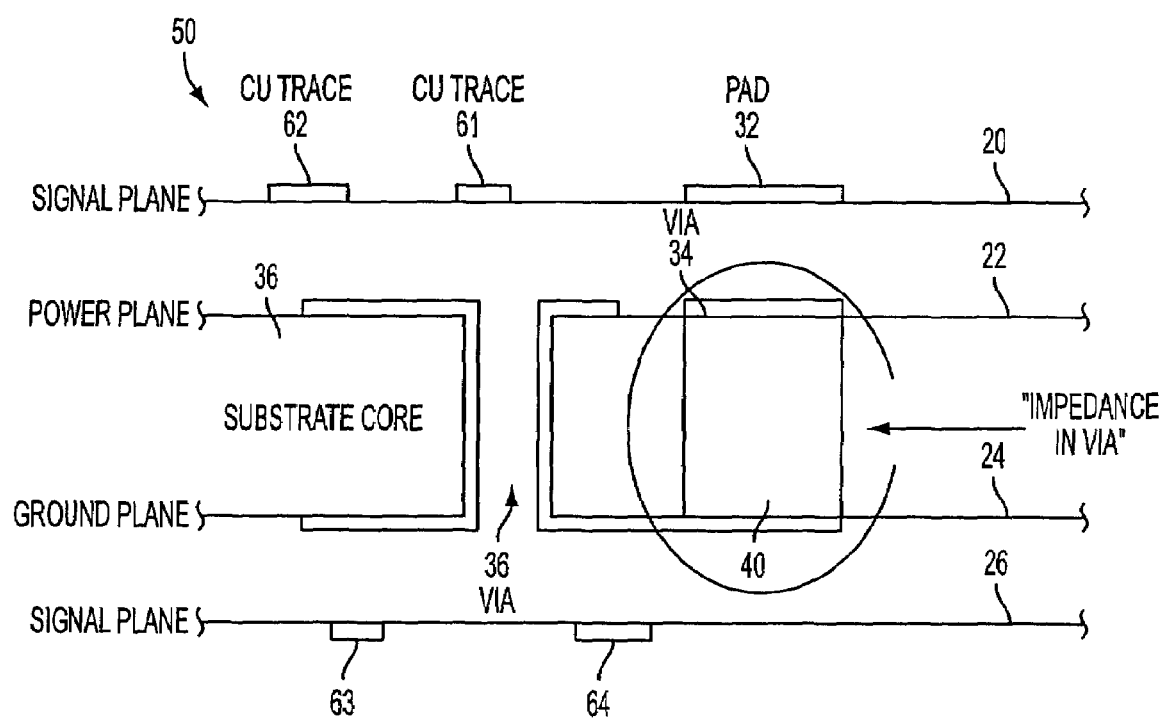
FIG. 2 illustrates a circuit board in accordance with one embodiment of the present invention.

FIG. 2 illustrates a circuit board 50 in accordance with one embodiment of the present invention. Circuit board 50 includes four layers: signal planes 20 and 26; a power plane 22; and a ground plane 24. Power plane 22 and ground plane 24 are sandwiched around a substrate core 36. Circuit board 50 further includes a pad 32, and copper ("Cu") traces 61–64. Finally, circuit board 50 includes multiple vias 34 and 36 that are openings spanning two or more planes.

In order to add impedance between planes of circuit board 50, an impedance component is inserted inside a via and coupled to each of the planes. An impedance component is a circuit device that adds impedance, such as a resistor or a capacitor. In the example shown in FIG. 2, an impedance component 40 is placed inside via 34 and connects power plane 22 directly to ground plane 24.

If a resistance impedance is desired, in one embodiment a resistor is formed by rolling carbon material into a cylinder of approximately the same diameter as via 34. The "roll" is then cut into the desired height approximating the height of via 34, and is capped with conductive material. The resistor roll is then press fitted into via 34 using, for example, forced air, and each cap is coupled to one of the planes.

If a capacitance impedance is desired, in one embodiment a capacitor is formed by rolling a sandwich of a dielectric material on top of conductive material to the desired diameter. The "roll" is then cut to the desired height, and the interior and exterior of the roll is capped. The capacitor roll is then press fitted into via 34 and each cap is coupled to one of the planes.

By placing an impedance component in a via of a circuit board, various advantages over prior art methods of adding impedance are achieved. The advantages include: eliminating the process of hand soldering the capacitor/resistor; not occupying any real estate on the circuit board; and eliminating high frequency noise that would otherwise be picked up by a trace.

As described, the present invention places impedance components in vias of a circuit board in order to add impedance between planes. This eliminates many problems associated with adding impedance through trace lines and hand soldiered components.

Several embodiments of the present invention are specifically illustrated and/or described herein. However, it will be appreciated that modifications and variations of the present invention are covered by the above teachings and within the purview of the appended claims without departing from the spirit and intended scope of the invention.

For example, although a four layer circuit board is illustrated, any number of layers can utilize the invention in order to add impedance between two of the layers.

What is claimed is:

1. A circuit board comprising:
   a first plane;
   a second plane;
   a via spanning said first and second plane; and
   an impedance component placed in said via and coupled to said first plane and said second plane further comprising rolled carbon material having a first end and a second end.

2. The circuit board of claim 1, wherein said impedance component is a resistor.

3. The circuit board of claim 2, wherein said resistor comprises:
   a first conductive cap coupled to said first end, and a second conductive cap coupled to said second end;
   wherein said first conductive cap is coupled to said first plane, and said second conductive cap is coupled to said second plane.

4. A method of adding impedance to a circuit board having a first plane, a second plane, and a via spanning said first and second plane, said method comprising:
   forming an impedance component having a first conductive cap and a second conductive cap;
   placing said impedance component in said via; and
   coupling said first said to said first plane and said second cap to said second plan wherein said impedance component further comprises; rolled carbon material having a first end and a second end.

5. A circuit board comprising:
a plurality of planes;
a via spanning at least two of said planes; and
an impedance component placed in said via and coupled to at least two of said planes wherein said impedance component is a resistor further comprising:
  rolled carbon material having a first end and a second end: and
  a first conductive cap coupled to said first end, and
  a second conductive cap coupled to said second end;
wherein said first conductive cap is coupled to said first plane, and said second conductive cap is coupled to said second plane.

* * * * *

UNITED STATES PATENT AND TRADEMARK OFFICE
CERTIFICATE OF CORRECTION

PATENT NO. : 7,057,114 B2 Page 1 of 1
APPLICATION NO. : 10/612872
DATED : June 6, 2006
INVENTOR(S) : Terry Dishongh et al.

It is certified that error appears in the above-identified patent and that said Letters Patent is hereby corrected as shown below:

Column 2, Line 64: "said first said"
       Should be: --said first cap--

Signed and Sealed this

Nineteenth Day of December, 2006

JON W. DUDAS
*Director of the United States Patent and Trademark Office*